United States Patent
Imai et al.

(10) Patent No.: US 6,664,029 B1
(45) Date of Patent: Dec. 16, 2003

(54) METHOD OF FORMING PATTERN

(75) Inventors: Genji Imai, Kanagawa-ken (JP); Kengo Ohnishi, Kanagawa-ken (JP); Hiroyuki Honma, Kanagawa-ken (JP); Hideo Kogure, Kanagawa-ken (JP)

(73) Assignee: Kansai Paint Co., Ltd., Hyogo-ken (JP)

( * ) Notice: Subject to any disclaimer, the term of this patent is extended or adjusted under 35 U.S.C. 154(b) by 0 days.

(21) Appl. No.: 09/582,557

(22) PCT Filed: Nov. 2, 1999

(86) PCT No.: PCT/JP99/06116

§ 371 (c)(1),
(2), (4) Date: Aug. 30, 2000

(87) PCT Pub. No.: WO00/26726

PCT Pub. Date: May 11, 2000

(30) Foreign Application Priority Data

Nov. 2, 1998 (JP) .......................... 10-312156
Dec. 3, 1998 (JP) .......................... 10-344559
Mar. 12, 1999 (JP) .......................... 11-65749

(51) Int. Cl.$^7$ ................................ G03F 7/00
(52) U.S. Cl. .................... 430/313; 430/198; 430/199; 430/311; 430/312; 430/322; 430/330
(58) Field of Search ................ 430/311, 312, 430/322, 323, 198, 199, 313, 330

(56) References Cited

U.S. PATENT DOCUMENTS

| | | | | |
|---|---|---|---|---|
| 4,204,009 A | * | 5/1980 | Feng | |
| 4,572,764 A | * | 2/1986 | Fan | |
| 4,732,838 A | * | 3/1988 | Sechi | |
| 5,627,345 A | * | 5/1997 | Yamamoto et al. | 174/265 |
| 5,922,517 A | * | 7/1999 | Bhatt | |
| 6,001,739 A | * | 12/1999 | Konishi | 438/692 |
| 6,323,287 B1 | * | 11/2001 | Foster | |

FOREIGN PATENT DOCUMENTS

| | | |
|---|---|---|
| EP | 152377 | 8/1985 |
| JP | 295064/94 | 10/1984 |
| JP | 206293/86 | 9/1986 |
| JP | 221110/88 | 9/1988 |
| JP | 1-260831 | 10/1989 |
| JP | 223759/91 | 10/1991 |
| JP | 313136/94 | 11/1991 |
| JP | 4-147631 | 5/1992 |
| JP | 241338/93 | 9/1993 |
| JP | 6-77159 | 3/1994 |
| JP | 6-132208 | 5/1994 |
| JP | 6-242603 | 9/1994 |
| JP | 308733/94 | 11/1994 |
| JP | 313134/94 | 11/1994 |
| JP | 313135/94 | 11/1994 |
| JP | 321895/94 | 11/1994 |
| JP | 133449/95 | 5/1995 |
| JP | 146552/95 | 6/1995 |
| JP | 154042/95 | 6/1995 |
| JP | 224150/95 | 8/1995 |
| JP | 225474/95 | 8/1995 |
| JP | 5885/95 | 11/1995 |
| JP | 8-279488 | 10/1996 |
| JP | 28921/97 | 2/1997 |
| JP | 10-207046 | 8/1998 |

OTHER PUBLICATIONS

Surface Mount Technology (Jan. 1997), pp. 2–25.

\* cited by examiner

*Primary Examiner*—Mark F. Huff
*Assistant Examiner*—Kripa Sagar
(74) *Attorney, Agent, or Firm*—Fisher, Christen & Sabol

(57) ABSTRACT

A pattern-forming method which comprises the following steps:

(1) laminating an actinic ray-curable coating film layer onto the surface of an insulating film-forming resin layer.

(2) irradiating directly or through a photomask an actinic ray or host wave thereonto so as to obtain a predetermined pattern.

(3) subjecting the actinic ray-curable coating film layer to a developing treatment to form a resist pattern coating film consisting of the actinic ray-curable coating film layer, (4) and subjecting the insulating film-forming resin layer to a developing treatment, followed by removing.

22 Claims, No Drawings

METHOD OF FORMING PATTERN

FIELD OF THE INVENTION

The present invention relates to a novel pattern-forming method, more particularly relates to a pattern-forming method which comprises laminating an actinic ray-curable coating film layer onto the surface of an insulating coating film-forming resin layer to obtain an laminate, directly irradiating a laser beam onto the laminate so that a predetermined relief may be obtained on the surface of the actinic ray-curable coating film layer, followed by subjecting the actinic ray-curable coating film layer to a developing treatment to form a resist pattern and subjecting an exposed insulating film-forming resin layer to a developing treatment, or directly irradiating a laser beam followed by simultaneously subjecting the actinic ray-curable coating film layer and the insulating film-forming resin layer to a developing treatment to obtain a predetermined pattern respectively.

BACKGROUND ART

The lithography in the art has been applied to a printed-circuit board, display panel, etching etc. as a method of forming a pattern on plastics, inorganic materials, etc.

The above method of forming the pattern comprises, for example, coating an actinic ray-curable, insulating pigment paste onto the surface of a substrate to form an actinic ray-curable, insulating layer, followed by irradiating through a photomask an electron beam or ultraviolet light onto the surface thereof, and subjecting the actinic ray-curable, insulating layer to a developing treatment to obtain a predetermined pattern.

However, the above method has such drawbacks that an unsatisfactory actinic ray-curability of the insulating layer makes it impossible to obtain a sharp pattern.

DISCLOSURE OF THE INVENTION

For the purpose of solving the above problems, the present inventors made intensive studies to find out that a pattern-forming method which comprises laminating an actinic ray-curable coating film layer onto the surface of an insulating film-forming resin layer so as to form a pattern, followed by irradiating directly or through a photomask an actinic ray or heat wave onto the surface thereof to form a predetermined resist pattern, successively subjecting the actinic ray-curable coating film layer and the insulating film-forming resin layer to a developing treatment and optionally removing the actinic ray-curable coating film layer, or followed by irradiating directly or through a photomask an actinic ray or heat wave onto the surface thereof and simultaneously subjecting the actinic ray-curable coating film layer and the insulating film-forming resin layer to a developing treatment respectively makes it possible to solve the above problems, resulting in completing the present invention.

That is, the present invention relates to a pattern-forming method which comprises the following steps:

(1) laminating an actinic ray-curable coating film layer onto the surface of an insulating film-forming resin layer, (2) irradiating directly or through a photomask an actinic ray or heat wave thereonto so as to obtain a predetermined pattern, (3) subjecting the actinic ray-curable coating film layer to a developing treatment to form a resist pattern coating film consisting of the actinic ray-curable coating film layer, (4) and subjecting the insulating film-forming resin layer to a developing treatment, followed by removing; and a pattern-forming method which comprises the following steps:

(1) laminating an actinic ray-curable coating film layer onto the surface of an insulating film-forming resin layer, (2) irradiating directly or through a photomask an actinic ray or heat wave thereonto so as to obtain a predetermined pattern, and (3') simultaneously subjecting the actinic ray-curable coating film layer and the insulating film-forming resin layer to a developing treatment so as to obtain a predetermined pattern, followed by removing.

PREFERABLE EMBODIMENT OF THE INVENTION

The actinic ray-curable coating film layer used in the present invention may include any known ones without particular limitations so long as difference in solubility in a developing solution depending on curing or decomposition in an actinic ray or heat wave-irradiated area makes it possible to form a resist pattern coating film.

Examples of a composition used in the actinic ray-curable coating film layer may include a liquid resist, photocurable resin composition such as an organic solvent based positive type photocurable resin composition, organic solvent based negative type photocurable resin composition, water based positive type photocurable resin composition, water based negative type photocurable resin composition and the like; a photocurable dry film such as a positive type photocurable dry film, negative type photocurable dry film and the like; a liquid heat-curable resin composition such as an organic solvent based negative type heat-curable resin composition, water based negative type heat-curable resin composition and the like; a heat-curable dry film such as a negative type heat-curable dry film, and the like.

Of these, particularly, the photocurable resin composition may preferably include visible light, negative type or positive type ones.

The negative type photocurable resin composition may include known ones containing, for example, a photocurable resin, photoreaction initiator and optionally a photosensitized dyestuff.

The photocurable resin may include any known photocurable resins having a photocurable group crosslinkable on photoirradiation and having such an ionic group, i.e. anionic group or cationic group, in the resin that an unexposed coating film may be dissolved in an alkaline developing solution or an acid developing solution to be removed without particular limitations. Examples of an unsaturated group as the photocurable group contained in the photocurable resin may include acryloyl group, methacryloyl group, vinyl group, styryl group, allyl group and the like.

A typical example of the anionic group as the ionic group may include carboxyl group. A carboxyl group content may be such that an acid value of the resin is preferably in the range of about 10 to 700 mg KOH/g, particularly about 20 to 600 mg KOH/g. When the acid value is less than about 10 mg KOH/g, a poor solubility of an uncured coating film during the developing treatment by use of the developing solution results drawbacks of unsatisfactory removal of copper during the following etching step. On the other hand, when the acid value is more than about 700 mg/KOH/g, a resist film or a cured coating film may easily come away, resulting in drawbacks of making it impossible to form a satisfactory copper circuit. A typical example of the cationic group may include amino group. An amino group content may preferably be such that an amine value of the resin is in the range of about 20 to 650, particularly about 30 to 600. An amine value less than about 20 results drawbacks of unsatisfactory removal of copper during the etching step as above mentioned. On the other hand, an amine value more than about 650 may undesirably result such drawbacks that the resist film may easily come away.

The anionic resin may include, for example, ones prepared by reacting polycarboxylic acid resin with a monomer such as glycidyl (meth)acrylate and the like so as to introduce unsaturated group and carboxyl group into the resin.

The cationic resin may include, for example, a resin prepared by an addition reaction between a hydroxyl group and tertiary amino group-containing resin and a reaction product of a hydroxyl group-containing unsaturated compound with a diisocyanate compound.

Details of the anionic resin and the cationic resin may be referred to the photocurable resin disclosed in Japanese Patent Application Laid-Open No. 223759/91.

The photoreaction or radical photopolymerization initiator may include ones known in the art, for example, aromatic carbonyl compounds such as benzophenone, benzoin methyl ether, benzoin isopropyl ether, benzylxanthone, thioxanthone, anthraquinone and the like; acetophenones such as acetophenone, propiophenone, α-hydroxyisobutylphenone, α, α'-dichloro-4-phenoxyacetophenone, 1-hydroxy-1-cyclohexylacetophenone, diacetylacetophenone, and the like; organic peroxides such as benzoyl peroxide, t-butylperoxy-2 ethylhexanoate, t-butylhydroperoxide, di-t-butyl-diperoxyisophtharate, 3,3',4,4'-tetra (t-butylperoxycarbonyl)benzophenone and the like; diphenyl halonium salts such as diphenyliodomium bromide, diphenyliodonium chloride and the like; organohalides such as carbon tetrabromide, chloroform, iodoform and the like; heterocyclic and polycyclic compounds such as 3-phenyl-5-isooxazolone, 2,4,6-tris(trichloromethyl)-1,3,5-triazine benzanthrone and the like; azo compounds such as 2,2'-azo (2,4-dimethylvaleronitrile), 2,2'-azobisisobutylonitrile, 1,1'-azobis(cyclohexane-1-carbonitrile), 2,2'-azobis(2-methylbutylonitrile) and the like; iron-allene complex (see European Patent No. 152377), titanocene compound (see Japanese Patent Application Laid-Open No. 221110/88), bisimidazole based compounds; N-arylglycidyl based compounds; acrydine based compounds; combinations of aromatic ketone with aromatic amine; peroxyketal (see Japanese Patent Application Laid-Open No. 321895/94), and the like. Of the above radical photopolymerization initiators, di-t-butyldiperoxyisophthalate, 3,3',4,4'-tetra (t-butylperoxycarbonyl) benzophenone, iron-allene complex and titanocene compound are preferable because of high activity on crosslinking or polymerization.

Trade names, of the radical photopolymerization initiator may include Irgacure 651 (marketed by Ciba Geigy Limited, trade name, acetophenone based radical photopolymerization initiator), Irgacure 184 (marketed by Ciba Geigy Limited, trade name, acetophenone based radical Photopolymerization initiator), Irgacure 1850 (marketed by Ciba Geigy Limited, trade name, acetophenone based radical photopolymerization initiator), Irgacure 907 (marketed by Ciba Geigy Limited, trade name, aminoalkylphenone based radical photopolymerization initiator), Irgacure 369 (marketed by Ciba Geigy Limited, trade name, aminoalkylphenone based radical photopolymerization initiator), Lucirin TPO (marketed by BASF Ltd., trade name, 2,4,6-trimethylbenzoyl diphenylphosphine oxide), Kayacure DETXS (marketed by Nippon Kayaku Co., Ltd., trade name), CGI-784 (marketed by Coba Geigy Limited, trade name, titanium complex compound), and the like. These may be used alone or in combination.

A mixing amount of the photoreaction initiator is in the range of 0.1 to 25 parts by weight, preferably 0.2 to 10 parts by weight per 100 parts by weight of the photocurable resin.

The photosensitizer may include known photosensitive dyes.

Examples of photosensitive dyes may include ones based on thioxanthene, xanthene, ketone, thiopyrylium salt, base styryl. Merocyanine, 3-substituted coumarine, 3,4-substituted coumarine, cyanine, acrydine, thiazine, phenothiazine, anthracene, coronene, benzanthracene, perylene, merocyanine, ketocoumarine, fumarine, borate, and the like. These may be used alone or in combination. The borate based photosensitive dyes may include ones disclosed in, for example, Japanese Patent Application Laid-Open Nos. 241338/93, 5885/95 and 225474/95.

In addition to the above resins, a saturated resin may also be used. The saturated resin may be used for the purpose of inhibiting the solubility of a photopolymerizable composition, for example, as inhibitors of the solubility of the resist film in the alkaline developing solution, and the solubility in a strong alkali solution as used on removal of a photocured coating film. Examples of the saturated resin may include polyester resin, alkyd resin, (meth)acrylic resin, vinyl resin, epoxy resin, phenolic resin, natural resin, synthetic rubber, silicone resin, fluorocarbon resin, polyurethane resin and the like. These resins may be used alone or in combination.

The organic solvent based negative type photocurable resin composition may include ones prepared by dissolving or dispersing the above photocurable resin composition into an organic solvent such as ketones, esters, ethers, cellosolves, aromatic hydrocarbons, alcohols, halogenated hydrocarbons and the like.

In addition to the above photocurable resin composition, a water-developable photocurable resin composition may be used. The water-developable photocurable resin composition may include, for example, such a water based resin as to have a photopolymerizable group and ion-forming group in a novolac phenol type epoxy resin. The water based resin may be prepared by a process which comprises subjecting a part of the epoxy groups contained in the novolac phenol type epoxy resin and (meth)acrylic acid to addition reaction to make the resin photopolymerizable and reacting the epoxy group with, for example, a tertiary amine compound to form a water-soluble onium salt group. The above resin is such that an exposed area is photocured to be water-insoluble, but an unexposed area is water-developable due to the ion-forming group, and that volatilization of the ion-forming group by the post heating of the resin at about 140 to 200° C. for 10 to 30 minutes makes a coating film hydrophobic, resulting in making it possible to form a coating film free of a hydrophilic group such as carboxyl group, amino group and the like, and salts thereof, i.e. salts due to the developing solution in the resist film as in the above alkaki or acid-developable, photocurable resin composition, and showing good resist properties. In addition to the above water based resin, a radical polymer may also be used, which is prepared by a process which comprises subjecting a homopolymer of an epoxy group-containing radically polymerizable unsaturated monomer such as glycidyl (meth)acrylate, 3,4-epoxy cyclohexyl alkyl (meth) acrylate, vinyl glycidyl ether and the like or a copolymer of at least one of the above monomers with other radically polymerizable unsaturated monomer such as $C_{1-24}$ alkyl or cycloalkyl (meth)acrylates, radically polymerizable unsaturated aromatic compounds and the like, other than the movolac phenol type epoxy resin, and (meth)acrylic acid to addition reaction to make the resin photopolymerizable and reacting the epoxy group with, for example, a tertiary amine compound to form a water-soluble onium salt group.

The above resin compositions may be coated onto a substrate by a coating method such as a roller coating, roll coater coating, spin coater coating, curtain roll coater coating, spray coating, electrostatic coating, dip coating, silk printing, spin coating and the like, followed by optionally setting, and drying to obtain a resist film.

The surface of the photocurable resist film may be covered with a cover coat layer prior to being exposed to light for curing. The above cover coat layer may be used as a barrier to oxygen in air so that deactivation by oxygen of radicals generated on exposure to light may be controlled, resulting in smoothly proceeding curing of photocurable materials by exposure to light.

A negative type photocurable resin water based resist composition may be obtained by dissolving or dispersing the above negative type photocurable resin composition into water.

Dissolving or dispersing of the water based photocurable resin composition into water may be carried out by neutralizing an anionic group such as carboxyl group in the photopolymerizable composition with an alkaki as a neutralizing agent, or by neutralizing a cationic group such as amino group in the photopolymerizable composition with an acid as a neutralizing agent respectively. The water-developable composition may directly be dispersed or dissolved into water.

A negative type photocurable resin coating film prepared by coating an organic solvent based or water based negative type photocurable resin composition onto a substrate may directly be exposed to light so that a predetermined resist film or a printed image may be obtained, followed by subjecting an unexposed area of the coating film to an developing treatment with a developing solution so as to be removed.

A light source to be used in photocuring may include various lasers having an oscillating curve in a visible light region, and specifically argon laser having an oscillating curve in 488 nm, YAG-SHG laser having an oscillating curve in 532 nm and UV laser having an oscillating curve in the range of 351 to 364 nm.

An anionic negative type photocurable resin composition may be subjected to an alkaline developing treatment, and a cationic one may be subjected to an acid developing treatment.

The negative type photocurable dry film may be obtained, for example, by coating the negative type photocurable resin composition onto a release paper such as polyethylene terephthalate, and drying to volatilize water and the organic solvent. In use, the release paper may be removed.

The positive type photocurable resin composition may be explained hereinafter.

The positive type photocurable resin composition may contain, for example, a photo-acid generater, a resin and optionally a photosensitizer. The above resin is such that the photo-decomposition of the resin and the photosensitizer, or the decomposition of the resin and photosensitizer by the photo-generated acid may modify the resin in properties such as polarity, molecular weight and the like, resulting showing solubility in an alkaline or acid, water based developing solution. The above compositions may optionally contain other resins etc. for controlling the solubility of the developing solution.

Typical Examples of the positive type photocurable resin composition may include a composition containing, as a main component, a resin obtained by bonding quinonediazidosulfonates through a sulfonate linkage to a base resin such as an acrylic resin having an ion-forming group and the like (see Japanese Patent Application Laid-Open No. 206293/86, Japanese Patent Application Laid-Open No. 133449/95, etc.), i.e. such a naphthoquinonediazido photocurable composition that photo-decomposition of a quinonediazido group by irradiation forms an indenecarboxylic acid through ketene; such a positive type photocurable composition that formation of a crosslinked coating film insoluble in an alkaline developing solution or acid developing solution by heating, followed by breaking down of the crosslinked structure with a photo-acid generator generating an acid group by irradiation, makes an irradiated area soluble in the alkaline developing solution or the acid developing solution (see Japanese Patent Application Laid-Open Nos. 295064/94, 308733/94, 313134/94, 313135/94, 313136/94, 146552/95, etc.), and the like. Details of the above positive type photocurable resin composition may be referred to the above literatures.

The photo-acid generator is a compound to generate an acid on irradiation of an acticic ray, is such that the resin may be decomposed in the presence of the generated acid as a catalyst, and may include ones known in the art.

The photo-acid generator may include, for example, onium salts such as sulfonium salt, ammonium salt, phosphonium salt, iodonium salt, selenium salt and the like; iron-allene complexes, ruthenium-allene complexes, silanol-metal chelate complexes, triazine compounds, diazidonaphthoquinone compounds, sulfonates, imidosulfonates, halogenated compounds, and the like. In addition to the above photo-acid generators, the photo-acid generators as disclosed in Japanese Patent Application Laid-Open Nos. 146552/95 and 289218/97 may also be used. The photo-acid generator may be a mixture with the resin, or may be bonded to the resin. A mixing amount of the photo-acid generator is in the range of about 0.1 to 40 parts by weight, particularly about 0.2 to 20 parts by weight per 100 parts by weight of the resin.

The organic solvent based, positive type photocurable resin composition may be prepared by dissolving or dispersing the positive type photocurable resin composition into an organic solvent such as ketones, esters, ethers, cellosolves, aromatic hydrocarbons, alcohols, halogenated hydrocarbons and the like.

The above resin compositions may be coated onto a substrate by a coating method such as a roller coating, roll coater coating, spin coater coating, curtain roll coater coating, spray coating, electrostatic coating, dip coating, silk printing, spin coating and the like, followed by optionally setting, and drying to obtain a resist film.

The water-based positive type photocurable resin composition may be obtained by dissolving or dispersing the positive type photocurable resin composition into water. Dissolving or dispersing into water in the water based positive type photocurable resin composition may be carried out by neutralizing carboxyl group or amino group in the positive type photocurable resin composition with an alkali or acid as a neutralizing agent.

The positive type photocurable coating film obtained by coating the organic solvent or water based positive type photocurable resin composition may optionally be subjected to setting, etc., followed by drying at about 50 to 130° C. to obtain a positive type photocurable coating film, directly exposing to light so that a predetermined resist film or a printed image may be obtained, and subjecting an exposed area of the coating film to a developing treatment with a developing solution for removing.

A light source used in exposure may be the same as above.

The developing treatment is such that an anionic positive type photocurable resin composition may be subjected to an alkali developing treatment, and a cationic one may be subjected to an acid developing treatment. As above described, in the case where the resin itself is water-soluble, a water developing treatment may be carried out.

The positive type photocurable dry film may include ones prepared, for example, by coating the positive type photocurable resin composition onto a release paper such as polyethylene terephthalate and the like, followed by drying to volatilize water and the organic solvent, and optionally heat curing. In use, the release paper may be removed.

The organic solvent based negative type heat-curable resin composition as the heat-curable resin composition may include ones prepared by dissolving or dispersing a resin composition crosslinkable by a heat wave such as infrared rays into an organic solvent. The above resin composition may include known ones, for example, hydroxyl group-containing resin/amino resin, hydroxyl group-containing resin/blocked polyisocyanate, melamine resin, silicone resin containing a hydrolyzable group such as alkoxysilyl group, hydroxysilyl group and the like or acrylic resin, epoxy resin/phenolic resin, epoxy resin/(anhydrous) carboxylic acid, epoxy resin/polyamine, unsaturated resin/radical polymerization catalyst such as peroxide and the like, carboxyl group and/or hydroxyphenyl group/ether linkage-containing olefinically unsaturated compound, and the like.

The water based negative type heat-curable resin composition may include ones prepared by introducing an acid group or basic group into a resin crosslinkable by a heat wave such as infrared rays and the like as above described, neutralizing with a basic compound or an acid compound as a neutralizing agent, and dissolving or dispersing into water respectively.

The negative type heat-curable dry film may include ones prepared, for example, by coating the negative type heat-curable resin composition onto a release paper such as polyethylene terephthalate and the like, followed by drying to volatilize water and the organic solvent. In use, the release paper may be removed.

A coating film from the above heat-curable resin composition may be directly heat-cured by the heat wave so that a predetermined resist film or printed image may be obtained, followed by subjecting an unexposed area of the coating film to a developing treatment with a suitable developing solution such as an organic solvent, acid, alkali and the like for removing. The heat wave may include, for example, a semiconductor laser (830 nm), YAG laser (1.06 μm) and the like.

Formation of the resist pattern film of the actinic ray-curable coating film layer is followed by removal of an exposed area of the non-actinic ray-curable coating film layer by a developing treatment.

The insulative resin layer used in the present invention may include, in addition to a non-curable, insulating film-forming resin layer which is a substrate finally forming a pattern and is not essentially cured by an energy on irradiation of the heat wave or light from the surface of the actinic ray-curable coating film layer, an insulative film-forming resin layer curable by a post heat treatment or post phototreatment.

The insulating film-forming resin layer may contain, as a developing resin, a resin having a glass transition temperature higher than a temperature on a developing treatment of the insulating film-forming resin layer. The developing resin may include such a resin that the insulating film-forming resin layer may be developable by the developing solution as a dissolution inhibitor, and may be used as a main component or additive resin of the insulating film-forming resin. Generally, in the case where a resin having an acid group or a basic group is used as a main component, the resin may be unable to be used as a highly insulative layer depending on uses. In that case, insulative properties may be imparted thereto by adding a co-crosslinking agent so that none of the acid group and basic group may remain by a chemical reaction between the acid group and the basic group, using as an additive resin, or by volatilizing the resin by a post heating so that insulative properties may be imparted by the remaining component, for example, an inorganic powder paste such as glass and the like, and the like.

The insulating film-forming resin layer is such that a finally formed coating film may contain the developing resin.

A material consisting of the developing resin is preferably such that a glass transition temperature of the insulating film-forming resin layer is higher than a temperature on the developing treatment, i.e. a temperature of a developing solution in the case of a liquid developing solution, or i.e. a temperature of a treating atmosphere in the case of a developing treatment by use of powder as in a sand blasting, and the like, particularly higher by about 5° C. or more, more preferably by about 10° C. to 200° C. The glass transition temperature lower than the developing temperature undesirably makes it impossible to obtain a pattern showing a high resolution by the developing treatment. The glass transition temperature may be measured by a differential scanning calorimeter (DSC).

The insulating film-forming resin layer has, as a finally formed film, a volume resistivity more than $10^9$ Ω·cm, particularly $10^{10}$ Ω·cm to $10^{18}$ Ω·cm.

A combination of actinic ray-curable coating film layer/insulating film-forming resin layer may include, for example, photocurable actinic ray coating film layer/photocurable insulating film-forming resin layer, photocurable actinic ray coating film layer/heat-curable insulating film-forming resin layer, heat-curable actinic ray coating film layer/photocurable insulating film-forming resin layer, heat-curable actinic ray coating film layer/heat-curable insulating;film-forming resin layer, photocurable actinic ray coating film layer/photocurable insulating film-forming resin layer, photocurable actinic ray coating film layer/non-curable insulating film-forming resin layer, heat-curable actinic ray coating film layer/non-curable insulating film-forming resin layer, and the like. Curing properties of the insulating film-forming resin layer means that in the case where the resin layer may not essentially be cured by an actinic ray irradiated onto the actinic ray-curable coating film layer, but may be post cured by a post treatment with heat, light, etc. after a developing treatment of the actinic ray-curable coating film layer.

The actinic ray-curable coating film layer may include a negative type one and a positive type one. The insulating film-forming resin layer may include a negative one and a positive one.

In the case where the actinic ray irradiated onto the surface of the actinic ray-curable coating film layer is a heat wave, such a non- or low heat-curable insulating film-forming resin layer that the insulating film-forming resin layer may not be cured or may be ineffectively cured by the irradiated actinic ray in comparison with the actinic ray curable or heat-curable coating film layer, may be used.

On irradiation of the heat wave, such a control of the heat wave that the actinic ray curable coating film layer may be cured, but the insulating film-forming resin layer may not be cured, may be carried out, for example, on one hand, by sufficiently heat curing the actinic ray curable coating film layer so as to be developable, and on the other hand, by controlling irradiation conditions such as a kind of the heat wave, irradiation time, irradiation dose and the like so that no adverse effects on the insulating film-forming resin layer by the developing treatment of the actinic ray-curable coating film layer may be provided. A resin composition of the actinic ray curable coating film layer may be the same as that of the insulating film-forming resin layer, but from the standpoint of an effect to be shown, preferably the resin composition of the insulating film-forming resin layer may be different from that of the actinic ray curable coating film layer. A combination of different photo-curable type layers may include, for example, heat-curable actinic ray coating film layer/heat-curable insulating film-forming resin layer, i.e. blocked polyisocyanate-curable type resin layer/amino-curable type resin layer, and the like.

In the case where the actinic ray irradiated onto the surface of the actinic ray-curable coating film layer is a light, such a non- or low photocurable insulating film-forming resin layer that the insulating film-forming resin layer may not be cured or may be ineffectively cured by the irradiated light in comparison with the photocurable actinic ray coating film layer, may be used.

On irradiation of the light, such a control of the light that the actinic ray curable coating film layer may be cured, but the insulating film-forming resin layer may not be cured, may be carried out, for example, on one hand, by sufficiently photo-curing the actinic ray curable coating film layer so as to be developable, and on the other hand, by controlling irradiation conditions such as a kind of the light, irradiation time, irradiation dose and the like so that no adverse effects on the insulating film-forming resin layer by the developing treatment of the actinic ray-curable coating film layer may be provided. A resin composition of the actinic ray curable coating film layer may be the same as that of the insulating film-forming resin layer, but from the standpoint of an effect to be shown, preferably the resin composition of the insulating film-forming resin layer may be different from that of the actinic ray curable coating film layer. A combination of different photo-curable type layers may include, for example, Photo-curable actinic ray coating film layer/photo-curable insulating film-forming resin layer, i.e. visible light-curable actinic ray coating film layer/ultraviolet light-curable resin layer, and the like.

In the case where the actinic ray irradiated onto the surface of the actinic ray-curable coating film layer is light, the insulating film-forming resin layer may be a heat-curable insulating resin layer. On the other hand, in the case where the actinic ray is a heat wave, the insulating film-forming resin layer may be a photo-curable insulating resin layer.

The insulating film-forming resin layer may be subjected to a developing treatment or a pattern formation, followed by heating, leaving to stand at room temperature, crosslinking by light or the like, or sintering (glass paste, etc.).

The insulating film-forming resin layer may be difficult to be specified depending on differences in kinds of the substrate and products, to which the method of the present invention is applicable, but may include, for example, (non) colored insulating layers consisting of thermosetting or thermoplastic plastics, photo-curable resin, inorganic substances, or mixtures thereof.

Kinds of the insulating film-forming resin layer used in the above substrate and product may include, for example, a black matrix insulating pattern, color filter insulating pattern, electronic part-conting pattern (solder coating film), ceramics or fluorescent substance insulating pattern, insulating pattern formed on the surface of a substrate such as a barrier pattern of a display panel, insulating substrates such as plastic printed circuit board, build up plastic substrate and the like, and the like.

Examples of the resin composition forming the insulating film-forming resin layer may include acrylic resin, polyester resin, alkyd resin, organic silicone resin, epoxy resin, melamine resin, vinyl resin, phenolic resin, fluorocarbon resin, polyurethane resin, oil-soluble polyimide-modified resin, inorganic silicone resin, modified resins of at least two resins of the above resins, and the like. In the case where the above resin is subjected to a powder treatment such as a blast developing treatment and the like, the use of the resin at the above glass transition temperature or higher makes it possible to remove the insulating resin layer by the blast treatment etc. without reducing a degree of resolution. In the case where the insulating film-forming resin layer is treated with a developing solution, in addition to keeping at the above glass transition temperature or higher, the use of an insulating film-forming resin soluble or dispersible in acid, alkali, water or organic solvent as the insulating film-forming resin for the purpose of making a liquid developing treatment easy may be preferable. In the insulating film-forming resin, for example, introduction of an acid group into the insulating film-forming resin makes possible the use of an alkaline developing solution, introduction of a basic group into the insulating film-forming resin makes possible the use of an acid developing solution, use of a water-soluble insulating film-forming resin makes possible the use of a water developing solution, and use of an insulating film-forming resin soluble or dispersible in an organic solvent makes possible the use of an organic solvent developing solution.

A typical example of the acid group in the above insulating film-forming resin is carboxyl group. A content of the carboxyl group may be such that an acid value of the resin is in the range of about 10 to 700 mg KOH/g, particularly about 20 to 600 mg KOH/g. An acid value less than about 10 mg KOH/g results such drawbacks that a poor releasability of the insulating film-forming resin layer by the treatment with an alkali developing solution makes it impossible to form a pattern having a high degree of resolution. On the other hand, an acid value more than about 700 results such drawbacks that release of unnecessary area of the insulating film-forming resin layer makes it impossible to form a pattern having a high degree of resolution. A typical example of the basic group is amino group. A content of the amino group is such that an amine value of the insulating film-forming resin is preferably in the range of about 20 to 650, particularly about 30 to 600. An amine value less than about 20 results such drawbacks that a poor releasability of the insulating film-forming resin layer makes it impossible to form a pattern having a high degree of resolution. On the other hand, an amine value more than about 650 results such drawbacks that release of an unnecessary area of the insulating film-forming resin layer makes it impossible to form a pattern having a high degree of resolution.

The acid group-containing resin may include, for example, acid group-containing acrylic resin, acid group-containing polyester resin, acid group-containing alkyd resin, acid group-containing organic silicone resin, acid group-containing vinyl resin, acid group-containing phenolic resin, acid group-containing fluorocarbon resin, acid group-containing polyurethane resin, modified resins of at least two of the above resins, and the like.

The basic group-containing resin may include, for example, basic group-containing acrylic resin, basic group-containing polyester resin, basic group-containing alkyd resin, basic group-containing organic silicone resin, basic group-containing vinyl resin, basic group-containing phenolic resin, basic group-containing fluorocarbon resin, basic group-containing polyurethane resin, alkali silicate resin, modified resins of at least two of the above resins, and the like.

The water-soluble resin may include, for example, polycarboxylic acid resin, cellulose resin, polyvinyl alcohol, melamine resin, onium salt-containing resin, and the like.

The organic solvent-soluble resin may include, for example, acrylic resin, polyester resin, alkyd resin, organic silicone resin, epoxy resin, vinyl resin, phenolic resin, melamine resin, fluorocarbon resin, polyurethane resin, oil-soluble polyimide-modified resin, inorganic silicone resin, modified resins of at least two of the above resins, and the like. These resins may contain acid or basic group.

The heat-curable insulating film-forming resin used in the insulating film-forming resin may include, for example, a self-curable resin and a combination of a curable functional group-containing resin with a curing agent. The self-curable resin may include, for example, melamine resin, silicone resin containing hydrolyzable group such as alkoxysilyl group, hydroxysilyl group and the like; cured resins with curing agent, for example, acrylic resin, epoxy resin/phenolic resin, hydroxy group-containing resin/polyisocyanate, hydroxy group-containing resin/amino resin, epoxy resin/(anhydrous)carboxylic acid, epoxy resin/polyamine, and the like.

The photo-curable insulating film-forming resin, used in the insulating film-forming resin may include, for example, the photo-curable resin described in the actinic ray-curable coating film layer.

The insulating film-forming resin layer may optionally contain a coloring agent such as pigment, dye, and the like, glass powder, filler, additive, and the like.

A method of forming the insulating film-forming resin layer may be selected deponding on purposes without particular limitations, and may typically include, for example, a method which comprises dissolving or dispersing the insulating film-forming resin into a solvent such as an organic solvent, water and the like to obtain an insulating film-forming resin solution, followed by coating or printing onto a substrate and volatilizing the solvent; a method of thermoforming pellets of the insulating film-forming resin so as to form a necessary shape; a method which comprises coating powder of the insulating film-forming resin onto a necessary area, followed by heating and melting, and the like. The insulating film-forming resin layer may be laminated onto the surface of other substrates such as glass, circuit board and the like, or may be a substrate such as circuit board and the like. A thickness of the insulating film-forming resin layer may vary depending on uses, but preferably is in the range of about 1 to 100 $\mu$m, particularly about 2 to 80 $\mu$m in the case of coating of a black matrix, etc. or printing, and in the case where the resin layer is fabricated and used as a substrate, preferably about 100 $\mu$m to 10 mm, particularly about 200 $\mu$m to 5 mm.

Removal of an exposed insulating film-forming resin layer may be carried out by a chemical method such as a treating with a liquid developing solution and the like, or a physical method such as sandblasting and the like.

The liquid developing treatment is such that, for example, spraying the developing solution onto the resin layer at a solution temperature of about 10 to 80° C., preferably about 15 to 50° C. for about 1 (one) to 60 minutes, preferably about 2 to 30 minutes, or dipping the resin layer into the developing solution makes it possible to form a pattern in the insulating film-forming resin layer.

The liquid developing treatment is such that, for example, in the case where an acid group is introduced into the insulating film-forming resin, an alkali developing solution may be used, in the case where a basic group is introduced into the insulating film-forming resin, an acid developing solution may be used, in the case where a hydrophilic group is introduced into the insulating film-forming resin, a water developing solution may be used, and in the case where the insulating film-forming resin is soluble or dispersible in an organic solvent, an organic solvent developing solution may be used.

The alkali developing solution may include an aqueous solution of an alkaline compound, for example, monomethylamine, dimethylamine, trimethylamine, monoethylamine, diethylamine, triethylamine, monoisopropylamine, diisopropylamine, triisopropylamine, monobutylamine, dibutylamine, moethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, and the like.

The acid developing solution may include an aqueous solution of an acid compound, for example, formic acid, crotonic acid, acetic acid, propionic acid, lacic acid, hydrohloric acid, sulfuric acid, nitric acid, phosphoric acid, and the like.

The organic solvent may include, for example, hydrocarbons such as hexane, heptane, octane, toluene, xylene, dichloromethane, chloroform, carbon tetrachloride, trichloroethylene and the like; alcohols such as methanol, ethanol, propanol, butanol and the like; ethers such as diethyl ether, dipropyl ether, dibutyl ether, ethyl vinyl ether, dioxane, propylene oxide, tetrahydrofuran, cellosolve, methylcellosolue, butylcellosolve, methylcarbitol, diethylene glycol monoethyl ether and the like; ketones such as acetone, methyl ethyl ketone, methyl isobutyl ketone, isophorone, cyclohexanone and the like; esters such as methyl acetate, ethyl acetate, propyl acetate, butyl acetate and the like; other solvents such as pyridine, formamide, N,N-dimethylformamide and the like, and the like.

The sandblasting method may optionally vary depending on a treated material and thickness, but is such that, for example, spraying 10 to 30 $\mu$m particles of calcium carbonate, glass beads, etc. under a pressure of 1 to 3 kg/cm$^2$ makes it possible to form a pattern in a nonactinic ray-curable layer. A developing temperature may not particularly be limited, but usually in the range of about 10 to 100° C., preferably about 20 to 80° C.

In the method of the present invention, the insulating film-forming resin layer may be subjected to a developing treatment to form a pattern, optionally followed by removing the actinic ray-curable layer. The insulating film-forming resin layer may optionally be heated or subjected to irradiation of an actinic ray so as to be crosslinked.

After the completion of the step (3') or (4) in the present invention, the actinic ray-curable layer may be removed by a known method. The known method, for example, is such that the actinic ray-curable layer may be removed by neutralizing with an alkali water in the case where the actinic ray-curable layer has an acid group, neutralizing with an acid water in the case where the actinic ray-curable layer has a basic group, dissolving with an organic solvent in the case where the actinic ray-curable layer is soluble in the organic solvent, and in the case of a positive type resist film with a crosslinked film formed by heating, by neutralizing with an alkali water or a weak acid such as sodium carbonate and the like an acid group generated by decomposing the crosslinked film by exposure to light respectively.

In the case where a dry resist film is used as the actinic ray-curable coating film layer in the present invention, the method of the present invention may be carried out by applying a dry resist film formed by laminating a supporting film layer or a release paper and the actinic ray-curable coating film layer to the insulating film-forming resin layer so that the actinic ray-curable coating film layer of the dry resist film may contact with the surface of the insulating film-forming resin layer, followed by removing the supporting film layer from the insulating film-forming resin layer, and performing the steps (2), (3) and (4) in the method of the present invention; by applying a dry resist film formed by laminating a supporting film layer and the actinic ray-curable coating film layer to the insulating film-forming resin layer so that the actinic ray-curable coating film layer of the dry resist film may contact with the surface of the insulating film-forming resin layer, followed by removing the supporting film layer from the insulating film-forming resin layer, and performing the steps (2) and (3') in the method of the present invention; by applying a dry resist film formed by laminating a supporting film layer and the actinic ray-curable coating film layer to the insulating film-forming resin layer so that the actinic ray-curable coating film layer of the dry resist film may contact with the surface of the insulating film-forming resin layer, followed by removing the supporting film layer from the insulating film-forming resin layer and performing the steps (2), (3) and (4), or followed by performing the step (2), removing the supporting film layer from the insulating film-forming resin layer, and performing the steps (3) and (4) of the present invention; by applying a dry resist film formed by laminating a supporting film layer and the actinic ray-curable coating film layer to the insulating film-forming resin layer, so that the actinic ray-curable coating film layer of the dry resist film may contact with the surface of the insulating film-forming resin layer, followed by removing the supporting film layer from the insulating film-forming resin layer, and performing the steps (2) and (3'), or followed by performing the step (2), removing the supporting film layer from the insulating film-forming resin layer, and performing the step (3') of the present invention; by laminating the insulating film-forming resin layer, the actinic ray-curable coating film layer and the supporting film layer to form a dry resist film, applying the dry resist film to a substrate so that the surface of the insulating film-forming resin layer in the dry resist film may contact with the surface of the substrate, followed by removing the supporting film layer from the insulating film-forming resin layer and performing the steps (2), (3) and (4) of the present invention, or followed by performing the step (2), removing the supporting film layer from the insulating film-forming resin layer and performing the steps (3) and (4) of the present invention; or by laminating the insulating film-forming resin layer, the actinic ray-curable coating film layer and the supporting film layer to form a dry resist film, applying the dry resist film to a substrate so that the surface of the insulating film-forming resin layer may contact with the surface of the substrate, followed by removing the supporting film layer from the insulating film-forming resin layer and performing the steps (2) and (3') of the present invention, or followed by performing the step (2) of the present invention, removing the supporting film layer from the insulating film-forming resin layer and performing the step (3') of the present invention.

In the present invention, the step (4) may be performed to form a pattern, followed by optionally post curing, and removing the actinic ray-curable coating film layer from the insulating film informing resin layer. The step (3') of the present invention may be performed to form a pattern, followed by post curing, and removing the actinic ray-curable coating film layer. The method of the present invention may be applicable to any uses so long as the above steps are included.

Examples of the above uses in respective industrial fields may include electrical fields such as electrical parts, lightings, electrical elements, semiconductors, printings, printed circuits, electronic communications, electric powers and the like; physical fields such as instrumentations, optical field, indications, acoustic field, controllings, vending field, signals, information recording field, and the like; chemistry·metallurgy·fiber fields such as inorganic chemistry, organic chemistry, polymer chemistry, metallurgy, fiber and the like; treatment·transportation fields such as separation·mixing, metal processing, plastics processing, printings, containers, packings and the like; articles for living, for example, agricultural and marine fields, foods fermentations, domestic articles, health·amusement fields, and the like; mechanical engineering, and the like.

The electrical fields may include, for example, a black matrix insulating film-forming method, insulating film-forming method by build up method, solder resist insulating film-forming method, display panel barrier-forming method, display panel black belt-forming method, color filter colored insulating film-forming method, display panel fluorescent substance, hologram pattern, CD mastering, coil and the like; physical fields may include, for example, photofiber fabricating, floppy disk, magnetic tape, magnetic card, optical parts, electrical radiation absorber and the like; the chemistry·metallurgy·fiber fields may include, for example, inorganic, glass, cement, ceramic insulators and the like; the treatment·transportation fields may include, for example, printed matter, print negative, diffiaction grating, marking, bar cord, mask, filter, etching, defroster, cement processing, store processing, fiber processing, plastic fabricating, label and the like; the articles for living may include, for example, carrier, cosmetic, fermentation industry, and the like; the mechanical enginerring may include, for example, micromachine parts and the like.

Typical examples of the application of the method of the present invention may briefly be explained hereinafter. The present invention should not be limited to these examples.

Black matrix-forming method: a black coating film layer as the insulating film-forming resin layer of the present invention is formed all over the surface of a substrate having on its surface transparent electrodes patterned in the shape of a stripe on a transparent glass plate, followed by laminating an actinic ray-curable coating film layer onto the black coating film layer, directly irradiating an actinic ray in the shape of a pattern onto the actinic ray-curable coating film layer so that the black coating film layer may remain in the shape of a grate and a transparent electrode-free area between stripe-shaped, transparent electrodes may be covered with the black coating film layer, subjecting the actinic ray-curable coating film layer to a developing treatment, subjecting the insulating film-forming resin layer to a developing treatment, and removing the actinic ray-curable coating film layer to form a black matrix. In place of the above developing treatment, the actinic ray-curable coating film layer and the insulating film-forming resin layer may be subjected to a developing treatment simultaneously.

A glass transition temperature of a resin forming the black coating film layer may preferably be higher than that of a resin forming the actinic ray-curable coating film layer by 5° C. or more. In connection with the above method, according to the method known in the art, a laser beam may be irradiated directly onto the surface of the black coating film layer in the shape of a pattern according to the laser abrasion method to remove an irradiated area of the black coating film layer.

The insulating film-forming resin layer-forming method according to the build up method: a multi-layer printed circuit board may be prepared by forming each layer of an insulating layer, conductor layer and interlayer-connecting via and building up the conductor layer.

The build up method known in the art is, for example, a method which comprises forming a photocurable insulating film layer on the surface of a circuit core board such as a copper-clad laminate, irradiating ultraviolet light through a mask, developing with an alkali or acid to form an insulating pattern layer having a via, heating and curing the insulating film layer, forming a conductor-plated layer or a conductor paste layer thereonto, forming a conductor pattern, optionally heat curing the conductor paste layer, optionally repeating the above steps of from the coating of the photocurable insulating film-forming resin to the formation of the conductor pattern to form a conductor printed circuit on the surface of the insulating film layer respectively.

The resin layer-forming method by the application of the above build up method to the method of the present invention may be, for example, a method which comprises forming an insulating film layer or the insulating film-forming resin layer of the present invention on the surface of the circuit core board, laminating the actinic ray-curable coating film layer of the present invention, irradiating an actinic ray directly onto the surface of the actinic ray-curable coating film layer so as to form a predetermined pattern, subjecting the actinic ray-curable coating film layer to a developing treatment, subjecting the insulating film-forming resin layer to a developing treatment, removing the actinic ray-curable coating film layer to form an insulating pattern layer, heating and curing the insulating-film-forming resin layer, forming a conductor-plated layer or a conductor paste layer thereonto, forming a conductor pattern, optionally heat curing the conductor paste layer, optionally repeating the above steps of from the formation of the insulating film-forming resin layer to the formation of the conductor pattern to form a conductor printed circuit on the surface of the insulating film-forming resin layer respectively.

On the other hand, the actinic ray-curable coating film layer and the insulating film-forming resin layer may be subjected to a developing treatment simultaneously.

Typical examples of the resin forming the insulating film-forming resin layer may include a heat-curable epoxy resin, polyimide resin (see Japanese Patent Application Laid-Open Nos. 154042195, 224150/95, Japanese Patent Application Nos. 26694/97, 309102/97, 26694/97), heat-curable PPE resin, heat-curable PPO resin, BT resin and the like.

The application methods and insulating materials regarding to the build up method may be referred to, for example, Surface Mount Technology (pages 2–25, January, 1997).

A glass transition temperature of a resin forming the insulating film layer may preferably be higher than a glass transition temperature of a resin forming the actinic ray-curable coating film layer by 5° C. or more.

Regarding to the above method, the method known in the art is a method which comprises irradiating ultraviolet light through a mask onto the surface of the photo-curable insulating film-forming resin layer to remove the insulating film-forming resin layer.

Solder resist film material: on soldering or plating on the printed circuit board for the purpose of preventing adhesion of a solder or plating solution onto an area other than a necessary area, or protecting a circuit on the printed circuit board, the coating film material is required to show good performances in heat resistance, adhesion properties, chemical resistance, electrical insulating properties, moisture resistance and the like.

The solder resist film known in the art is prepared by a method which comprises, for example, printing a negative type photocurable solder resist composition onto the surface of the printed circuit board, irradiating ultraviolet light onto an area required to form a resist film for photocuring, and developing and removing an area not required to form a resist film to form a resist film.

Regarding to the known solder resist film material, according to the method of the present invention, a resist film may be prepared, for example, by a method which comprises forming a resist film, insulating film or insulating film-forming resin layer of the present invention on the surface of the printed circuit board, laminating the actinic ray-curable coating film layer thereonto, irradiating an actinic ray directly onto the surface of the actinic ray-curable coating film layer so as to form a predetermined pattern, subjecting the actinic ray-curable coating film layer to a developing treatment, subjecting the insulating film-forming resin layer to a developing treatment, removing the actinic ray-curable coating film layer to form a resist film layer, and heat curing to form a resist film. In place of the above developing treatment, the actinic ray-curable coating film layer and the insulating film-forming resin layer may be subjected to a developing treatment simultaneously.

The resist composition may include, for example, ones prepared by adding a curing agent such as polycarboxylic acid compound, polyphenol compound, cationic polymerization catalyst and the like to epoxy resin.

The resin forming the resist film preferably has a glass transition temperature higher than a glass transition temperature of the resin forming the actinic ray-curable coating film layer by 5° C. or more.

Display panel barrier-forming method: in a method of forming a barrier on a base board constituting the display panel the method comprises forming a barrier-forming heat-curable insulating resin layer as the insulating film-forming resin layer of the present invention onto the base board, laminating the actinic ray-curable coating film layer of the present invention onto the surface thereof, irradiating an actinic ray onto the surface thereof to develop the actinic ray-curable coating film layer, subjecting an exposed area of the insulating film-forming resin layer to a developing treatment, and heat curing the insulating film-forming resin layer to form a barrier insulating pattern. The insulating film-forming resin layer may include, for example, a resin layer containing a glass paste and an organic resin or binder, and the resin may be a developing resin having a glass transition temperature higher than a developing temperature. The resin layer is such that on heat-curing, the glass paste may preferably be sintered, the organic resin component may preferably be volatilized, and the upper layer actinic ray-curable coating film layer may preferably be volatilized for removing. The developing treatment of the insulating film-forming resin layer may be carried out by a liquid developing treatment by use of acid, alkali, organic solvent, etc. or a sand blasting method.

Display panel black belt-forming method: a black belt or black stripe known in the art is used as a method of enhancing a contrast in a light room by the application to a plasma display, etc. A method of forming a black belt in the prior art comprises, for example, printing a photo-curable black glass paste prepared, for example, by incorporating a lead oxide-boron oxide-silicon dioxide based glass powder and a black pigment into a photocurable resin onto a base board, irradiating an ultraviolet light, developing to form a pattern, and heat curing usually at 550 to 800° C. for 10 to 30 minutes under an atmosphere of, for example, an inert gas, reducing gas, oxidizing gas and the like.

In the case of the application of the above method to the method of the present invention, a method of the present invention comprises, for example, forming a black insulating film layer formed from a black glass paste prepared by, for example, incorporating a lead oxide-boron oxide-silicon dioxide based glass powder and a black pigment into a resin as the insulating film-forming resin layer of the present invention onto a base board, laminating the actinic ray-curable coating film layer onto the surface thereof, irradiating onto the surface thereof, developing the actinic ray-curable coating film layer, subjecting an exposed area of the black insulating film-forming resin layer to a developing treatment, and heat curing the black insulating film layer to form a black belt. The developing treatment of the black belt layer may be carried out, for example, by an alkali developing treatment in the case where a resin having an acid group such as carboxyl group and the like is used, by an acid developing treatment in the case where a resin having a basic group such as amino group and the like is used, by an organic solvent developing treatment in the case where a resin soluble in an organic solvent is used, by a water developing treatment in the case where a resin soluble in water is used, and by a sand blast treatment, provided that a glass transition temperature of the above resins is higher than a developing treatment temperature.

Color filter-forming method: a color filter in the prior art is used in a display panel such as a liquid crystal and the like. A method of forming a color pattern in the color filter of the prior art comprises, for example, forming a photocurable resin layer onto the surface of a transparent conductive substrate, exposing to light so as to be a predetermined shape, developing and partly exposing the transparent conductive substrate, forming a colored film with a predetermined color in the exposed area, and repeating the above steps by necessary times to prepare a color filter.

In the case of the application of the above method to the method of the present invention, a method of the present invention comprises, for example, forming a colored film as the insulating film-forming resin layer of the present invention all over the surface of the transparent conductive substrate, laminating the actinic ray-curable coating film layer onto the surface of the above film, subjecting the actinic ray-curable coating film layer and the insulating film-forming resin layer to a developing treatment so that a necessary portion of the colored film may remain, optionally heat curing, forming a colored film with a predetermined color in an exposed area, and repeating the above steps by necessary times to prepare a color filter. The actinic ray-curable coating film layer and the insulating film-forming resin layer may be subjected to a developing treatment simultaneously.

EXAMPLE

The present invention will be explained more in detail by the following Examples, in which "part" and "%" represent "part by weight" and "% by weight" respectively.

Preparation Example of Water-Based Negative Type Photocurable Anionic Composition 1

A photocurable solution was prepared by adding one part of a photopolymerization initiator (CGI-784, trade name, marketed by Ciba Geigy Limited, titanocene compound) and one part of a photosensitizer (LS-148, Trade name, marketed by Mitsui Toatsu Chemicals, Inc. coumarin dye based compound) to 100 parts (as solid content) of a photocurable resin (resin solid content 55% by weight, propylene glycol monomethyl ether organic solvent, resin acid value 50 mg KOH/g, number average molecular weight about 20000) prepared by reacting an acrylic resin (resin acid value 155 mg KOH/g, methyl methacrylate/butyl acrylate/acrylic acid weight ratio=40/40/20) with 24 parts by weight of glycidyl methacrylate.

A mixture of 100 parts (as solid content) of the photocurable solution and 7 parts of triethylamine was stirred, followed by dispersing into deionized water to obtain a water-dispersed resin solution (solid content 15%).

Preparation Example of Water Based Negative Type Photocurable Cationic Composition 2

To 100 parts (as solid content) of a photocurable solution obtained by mixing 100 parts of a photocurable resin (amine value about 56, degree of unsaturation 1.83 moles/kg) obtained by an addition reaction of acrylic copolymer of methyl acrylate/styrene/butyl acrylate/glycidyl methacrylate/dimethylaminoethyl methacrylate weight ratio=20/10/22/30/18 with 15 parts of acrylic acid, 0.5 part of the photosensitizer used in the above composition 1, 55 parts of trimethylolpropane triacrylate, and 20 parts of the titanocene compound used in the above composition 1 was added 3 parts of acetic acid, followed by dispersing into deionized water to obtain a water-dispersed resin solution (solid content 15%).

Preparation Example of Water Based Positive Type Photocurable Anionic Composition 3

A mixture of 200 parts of tetrahydrofuran, 65 parts of p-hydroxystyrene, 28 parts of n-butyl acrylate, 11 parts of acrylic acid and 3 parts of azobisisobutylenitrile was reacted at 100° C. for 2 hours to obtain a reaction product, followed by pouring the reaction product into 1500 ml of toluene solvent, precipitating and separating the reaction product to obtain precipitates, and drying the precipitates at 60° C. to obtain a photocurable resin having a molecular weight of about 5200 and a hydroxyphenyl group content of 4.6 moles/kg.

To 100 parts (as solid content) of a formulation of 100 parts of the above photocurable resin, 60 parts of divinyl ether compound (condensation product of one mole of bisphenol compound with 2 moles of 2-chloroethyl vinyl ether), 10 parts of NAI-105 (photo-acid generator, trade name, marketed by Midori Kagaku Co., Ltd.) and 1.5 parts of NKX-1595 (photosensitive dye, trade name, marketed by Nippon Kankoshikiso Co., Ltd.) was added 7 parts of triethylamine, followed by mixing and stirring, and dispersing into deionized water to obtain a water-dispersed resin solution (solid content 15%).

Preparation Example of Water Based Positive Type Photocurable Cationic Composition 4

A mixture of 200 parts of tetrahydrofuran, 65 parts of p-hydroxystylene, 18 parts of dimethylaminoethyl methacrylate, 17 parts of n-butyl acrylate and 3 parts of azobisisobutylonitrile was reacted at 100° C. for 2 hours to obtain a reaction product, followed by pouring the reaction product into 1500 ml of toluene solvent, precipitating and separating the reaction product, and drying precipitates at 60° C. to obtain a pohotocurable resin having a molecular weight of about 5000 and a hydroxyphenyl group content of 4.6 moles/kg. Next, to 100 parts (as solid content) of a formulation of 100 parts of the photocurable resin, 60 parts of divinyl ether compound (condensation product of one mole of bisphenol compound with 2 moles of 2-chloroethyl vinyl ether), 10 parts of NAI-105 (photo-acid generator, trade name marketed by Midori Kagaku Co., Ltd.) and 1.5 parts of the photosensitizer used in the composition 3 was added 7 parts of hydroxyacetic acid, followed by mixing and stirring, and dispersing into deionized water to obtain a water-dispersed resin solution (solid content 15%).

Preparation Example of Organic Solvent Based Negative Type Photocurable Composition 5

The photocurable solution in the water based negative type photocurable composition 1 was dissolved in diethyleneglycol dinethyl ether solvent to obtain an organic solvent resin solution (solid content 30%).

Preparation Example of Organic Solvent Based Negative Type Photocurable Composition 6

The photocurable solution in the water based negative type photocurable composition 2 was dissolved in diethyleneglycol dimethyl ether solvent to obtain an organic solvent resin solution (solid content 30%).

Preparation Example of Organic Solvent Based Positive Type Photocurable Composition 7

The photocurable solution in the water based positive type photocurable anionic composition 3 was dissolved in diethyleneglycol dimethyl ether solvent to obtain an organic solvent, resin solution (solid content 30%).

Preparation Example of Organic Solvent Based Positive Type Photocurable Composition 8

The photocurable solution in the water based positive type photocurable cationic composition 4 was dissolved in diethyleneglycol dimethyl ether solvent to obtain an organic solvent resin solution (solid content 30%).

Preparation Example of Negative Type Dry Film 1

A negative type dry film 1 was prepared by coating the organic solvent based negative type photocurable composition 5 onto a polyethylene terephthalate film so as to be a dry film thickness of 20 μm by a roller coating, followed by volatilizing an organic solvent.

Preparation Example of Negative Type Dry Film 2

A negative type dry film 2 was prepared by coating the organic solvent based negative type photocurable composition 6 onto a polyethylene terephthalate film so as to be a dry film thickness of 20 μm by a roller coating, followed by volatilizing an organic solvent.

Preparation Example of Positive Type Dry Film 3

A positive type dry film 3 was prepared by coating the organic solvent based positive type photocurable composition 7 onto a polyethylene terephthalate film so as to be a dry film thickness of 20 μm by a roller coating, followed by setting, and heating at 90° C. for 30 minutes.

Preparation Example of Positive Type Dry Film 4

A positive type dry film 4 was prepared by coating the organic solvent based positive type photocurable composition 8 onto a polyethylene terephthalate film so as to be a dry film thickness of 20 μm by a roller coating, followed by setting, and heating at 90° C. for 30 minutes.

Preparation Example of Organic Solvent Based Heat-Curable Composition 1

(methylmethacrylate/styrene/n-butylmethacrylate/3,4-epoxycyclohexyl methacrylate/oxatane methacrylate weight ratio=45/10/10/25/10, weight average molecular weight 10000) and one part of Cyracure UVI-6990 (trade name, marketed by Union Carbide Japan K.K., cationic polymerization catalyst) was dissolved in a toluene organic solvent to obtain organic solvent based heat-curable composition 1 (solid content 50% by weight).

Preparation Example of Black Coating Composition A

A mixture of 61 parts of methyl methacrylate, 20 parts of n-butyl acrylate, 4 parts of hydroxyethyl acrylate, 15 parts of acrylic acid and 10 parts of t-butylperoxybenzoate was dropped into 100 parts of 2-butoxyethanol heated at 110° C. in a flask with agitation over 2 hours, followed by keeping at that temperature for 2 hours to obtain an acrylic resin solution (glass transition temperature 48° C., resin weight average molecular weight 16000) having a solid content of about 50%. To 200 parts of the acrylic resin solution having a solid content of about 50% were added 10 parts of isobutyl acetate, 148 parts of 3-methoxybutyl acetate, 12 parts of BYK160 (trade name, marketed by BYK Chemie Co., high molecular copolymer pigment dispersant), one part of hexamethoxymelamine and, 100 parts of carbon black were added, followed by carrying out a pigment dispersion to obtain a black pigment paste. To 320 parts of the black pigment paste was added 780 parts of 3-methoxybutyl acetate to obtain a black coating composition.

Preparation Example of Black Coating Composition B

A mixture of 53 parts of methyl methacrylate, 11 parts of acrylic acid, 37 parts of n-butyl acrylate and 10 parts of t-butylperoxybenzoate was dropped into 100 parts of 2-butoxyethanol heated at 110° C. in a flask with agitation over 2 hours, followed by keeping at that temperature for 2 hours to obtain an acrylic resin solution (glass transition temperature 25° C., resin weight average molecular weight 16000) having a solid content of about 50%. To 2.00 parts of the acrylic resin solution having a solid content of about 50% were added 10 parts of isobutyl acetate, 148 parts of 3-methoxybutyl acetate, 12 parts of BYK160 (trade name, marketed by BYK Chemie Co., high molecular copolymer pigment dispersant), 5 parts of Epon 1001 (marketed by Oil Shell Co., Ltd., epoxy resin) and, 100 parts of carbon black were added, followed by carrying out a pigment dispersion to obtain a black pigment paste. To 320 parts of the black pigment paste was added 780 parts of 3-methoxybutyl acetate to obtain a black coating composition.

Preparation Example of Black Coating Composition C

A mixture of 24 parts of dimethylaminoethyl methacrylate, 65 parts of methyl methacrylate, 11 parts of n-butyl, acrylate and 10 parts of t-butylperoxybenzoagte was dropped into 100 parts of 2-butoxyethanol heated at 110° C. in a flask with agitation over 2 hours, followed by keeping at that temperature for 2 hours to obtain an acrylic resin solution (glass transition temperature 55° C., resin weight average molecular weight 15000) having a solid content of about 50%. To 200 parts of the acrylic resin solution having a solid content of about 50% were added 10 parts of isobutyl acetate, 148 parts of 3-methoxybutyl acetate, 12 parts of BYK160 (trade name, marketed by BYK Chemie Co., high molecular copolymer pigment dispersant), 5 parts of Epon 1001 (marketed by Oil Shell Co., Ltd., epoxy resin) and, 100 parts of carbon black were added, followed by carrying out a pigment dispersion to obtain a black pigment paste. To 320 parts of the black pigment paste was added 780 parts of 3-methoxybutyl acetate to obtain a black coating composition.

Preparation Example of Black Coating Composition D

Black coating composition D was prepared in the same manner as in black coating composition A except that 20 parts of triglycidylisocyanulate was added per 100 parts of the acrylic resin (as solid content) used in black coating composition A.

Preparation Example of Black Coating Composition E (Comparative)

A mixture of 42 parts of methyl methacrylate, 5 parts of acrylic acid, 53 parts of n-butyl acrylate and 10 parts of t-butylperoxybenzoate was dropped into 100 parts of 2-butoxyethanol heated at 110° C. in a flask with agitation over 2 hours, followed by keeping at that temperature for 2 hours to obtain an acrylic resin solution (glass transition temperature 0° C., resin weight average molecular weight 16000) having a solid content of about 50%. To 200 parts of the acrylic resin solution having a solid content of about 50% were added 10 parts of isobutyl acetate, 148 parts of 3-methoxybutyl acetate, 12 parts of BYK160 (trade name, marketed by BYK Chemie Co., high molecular copolymer pigment dispersant), one part of hexamethoxymelamine and, 100 parts of carbon black were added, followed by carrying out a pigment dispersion to obtain a black pigment paste. To 320 parts of the black pigment paste was added 780 parts of 3-methoxybutyl acetate to obtain a black coating composition.

Example 1

The black coating composition A was coated by a spin coater onto all over the surface of a base board having on its surface a transparent electrode patterned in the shape of stripe of line (pattern width)/space=100/20 µm on a transparent glass plate (200×200×1.1 mm), followed by predrying at 80° C. for 10 minutes to form a black coating film having a thickness of about 5 µm.

Next, the water based negative type photocurable anionic composition 1 was coated onto the black coating film so as to be a dry filmthickness of 6 µm by roller coating, followed by drying at 80° C. for 10 minutes to form a negative type photocurable anionic coating film on the black coating film.

Next, an argon laser (oscillating wave length 488 nm) of 5 mj/cm$^2$ was irradiated in the shape of a pattern directly onto the surface of the negative type photocurable anionic coating film for exposing to light so that the black coating film may remain in the shape of a grate and an area free of the transparent electrode between stripe-shaped transparent electrodes may be covered with the black coating film, followed by dipping into an alkali developing solution (a) consisting of 0.25 wt % aqueous sodium carbonate solution at 25° C. for 60 seconds to develop the non-exposed anionic coating film and black coating film simultaneously.

Next, the negative type photocurable anionic resist film in the exposed area was removed by a 3% aqueous caustic soda solution to form a black matrix.

The black matrix was well patterned in the shape of a stripe of line (pattern width)/space=100/20 µm. On the other hand, in the case where the black coating film has a film thickness of 15 µm by three times, the black matrix was well patterned in the shape of a stripe of line (pattern width)/space=100/20 µm. The black coating film formed as above had a volume resistivity of $10^{10}$ Ω·cm or more to be good.

Example 2

A black coating film was formed on a transparent glass plate in the same manner as in Example 1

Next, the water based negative type photocurable cationic composition 2 was coated onto the black coating film so as to be a dry filmthickness of 6 µm by roller coating, followed by drying at 80° C. for 10 minutes to form a negative type photocurable cationic coating film on the black coating film.

Next, an argon laser (oscillating wave length 488 nm) of 5 mj/cm$^2$ was irradiated in the shape of a pattern directly onto the surface of the negative type photocurable cationic coating film for exposing to light so that the black coating film may remain in the shape of a grate and an area free of the transparent electrode between stripe-shaped transparent electrodes may be covered with the black coating film, followed by dipping into an acid developing solution (b) consisting of a 1 wt % aqueous acetic acid solution at 25° C. for 60 seconds for developing.

Next, the black coating film in the exposed area was developed by the alkali developing solution (a) at 25° C.

Next, the negative type photocurable cationic resist film in the exposed area was removed by a 3% aqueous hydrochloric acid solution to form a black matrix.

The black matrix was well patterned in the shape of a stripe of line/space=100/20 µm. On the other hand, in the case where the black coating film has a film thickness of 15 µm by three times, the black matrix was well patterned in the shape of a stripe of line/space=100/20 µm. The black coating film formed as above had a volume resistivity of $10^{10}$ Ω·cm or more to be good.

Example 3

A black coating film was formed on a transparent glass plate in the same manner as in Example 1

Next, the water based positive type photocurable anionic composition 3 was coated onto the black coating film so as to be a dry filmthickness of 6 μm by roller coating, followed by drying at 80° C. for 20 minutes to form a positive type photocurable anionic coating film on the black coating film.

Next, an argon laser (oscillating wave length 488 nm) of 5 mj/cm$^2$ was irradiated in the shape of a pattern directly onto the surface of the positive type photocurable anionic coating film for exposing to light so that the black coating film may remain in the shape of a grate and an area free of the transparent electrode between stripe-shaped transparent electrodes may be covered with the black coating film, followed by dipping into the alkali developing solution (a) at 25° C. for 60 seconds to develop the exposed anionic coating film and black coating film simultaneously.

Next, the positive type photocurable anionic resist film in the non-exposed area was removed by a 3% aqueous caustic soda solution to form a black matrix.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 4

A black coating film was formed on a transparent glass plate in the same manner as in Example 1.

Next, the water based positive type photocurable cationic composition 4 was coated onto the black coating film so as to be a dry filmthickness of 6 μm by roller coating, followed by drying at 80° C. for 20 minutes to form a positive type photocurable cationic coating film on the black coating film.

Next, an argon laser (oscillating wave length 488 nm) of 5 mj/cm$^2$ was irradiated in the shape of a pattern directly onto the surface of the positive type photocurable cationic coating film for exposing to light so that the black coating film may remain in the shape of a grate and an area free of the transparent electrode between stripe-shaped transparent electrodes may be covered with the black coating film, followed by dipping into the acid developing solution (b) at 25° C. for 60 seconds to develop the exposed cationic coating film.

Next, the black coating film in the exposed area was developed by the alkali developing solution (a) at 25° C.

Next, the positive type photocurable cationic resist film in the non-exposed area was removed by a 3% aqueous hydrochloric acid solution to form a black matrix.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 5

A black coating film was formed on a transparent glass plate in the same manner as in Example 1.

Next, the organic solvent based negative type photocurable composition 5 was coated onto the black coating film so as to be a dry film thickness of 6 μm by roller coating, followed by drying at 80° C. for 20 minutes to form a negative type photocurable coating film on the black coating film.

Next, an argon laser (oscillating wave length 488 nm) of 5 mj/cm$^2$ was irradiated in the shape of a pattern directly onto the surface of the negative type photocurable coating film for exposing to light so that the black coating film may remain in the shape of a grate and an area free of the transparent electrode between stripe-shaped transparent electrodes may be covered with the black coating film, followed by dipping into the alkali developing solution (a) at 25° C. for 60 seconds to develop the non-exposed photocurable coating film and black coating film simultaneously.

Next, the negative type photocurable resist film in the non-exposed area was removed by a 3% aqueous caustic soda solution to form a black matrix.

The back matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 6

A black coating film was formed on a transparent glass plate in the same manner as in Example 1.

Next, the organic solvent based negative type photocurable composition 6 was coated onto the black coating film so as to be a dry film thickness of 6 μm by roller coating, followed by drying at 80° C. for 20 minutes to form a negative type photocurable coating film on the black coating film.

Next, an argon laser (oscillating wave length 488 nm) of 5 mj/cm$^2$ was irradiated in the shape of a pattern directly onto the surface of the negative type photocurable coating film for exposing to light so that the black coating film may remain in the shape of a grate and an area free of the transparent electrode between stripe-shaped transparent electrodes may be covered with the black coating film, followed by dipping into the acid developing solution (b) at 25° C. for 60 seconds for developing.

Next, the negative type photocurable resist film in the non-exposed area was removed by a 3% aqueous hydrochloric acid solution to form a black matrix.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 7

A black coating film was formed on a transparent glass plate in the same manner as in Example 1.

Next, the organic solvent based positive type photocurable composition 7 was coated onto the black coating film 'so as to be a dry film, thickness of 6 μm by roller coating, followed by drying at 90° C. for 20 minutes to form a positive type photocurable coating film on the black coating film.

Next, an argon laser (oscillating wave length 488 nm) of 5 mj/cm$^2$ was irradiated in the shape of a pattern directly onto the surface of the positive type photocurable coating film for exposing to light so that the black coating film may remain in the shape of a grate and an area free of the transparent electrode between stripe-shaped transparent electrodes may be covered with the black coating film, followed by dipping into the alkali developing solution (a) at 25° C. for 60 seconds for developing.

Next, the positive type photocurable resist film in the non-exposed area was removed by a 3% aqueous caustic soda solution to form a black matrix.

The black matrix was well patterned in the shape of a stripe of line/space=100/20 µm. On the other hand, in the case where the black coating film has a film thickness of 15 µm by three times, the black matrix was well patterned in the shape of a stripe of line/space=100/20 µm. The black coating film formed as above had a volume resistivity of $10^{10}$ Ω·cm or more to be good.

Example 8

A black coating film was formed on a transparent glass plate in the same manner as in Example 1.

Next, the organic solvent based positive type photocurable composition 8 was coated onto the black coating film so as to be a dry film thickness of 6 µm by roller coating, followed by drying at 90° C. for 20 minutes to form a positive type photocurable coating film on the black coating film.

Next, an argon laser (oscillating wave length 488 nm) of 5 mj/cm² was irradiated in the shape of a pattern directly onto the surface of the positive type photocurable coating film for exposing to light so that the black coating film may remain in the shape of a grate and an area free of the transparent electrode between stripe-shaped transparent electrodes may be covered with the black coating film, followed by dipping into the acid developing solution (b) at 25° C. for 60 seconds for developing.

Next, the exposed black coating film was developed by the alkali developing solution at 25° C.

Next, the positive type photocurable resist film in the non-exposed area was removed by a 3% aqueous hydrochloric acid solution to form a black matrix.

The black matrix was well patterned in the shape of a stripe of line/space=100/20 µm. On the other hand, in the case where the black coating film has a film thickness of 15 µm by three times, the black matrix was well patterned in the shape of a stripe of line/space=100/20 µm. The black coating film formed as above had a volume resistivity of $10^{10}$ Ω·cm or more to be good.

Example 9

A black coating film was formed on a transparent glass plate in the same manner as in Example 1.

Next, the negative type dry film 1 was laminated on the above black coating film so that a photocurable surface of the dry film may be folded thereon, followed by removing the polyethylene terephthalate release paper to form a negative type photocurable dry film on the black coating film.

Next, an argon laser (oscillating wave length 488 nm) of 5 mj/cm² was irradiated in the shape of a pattern directly onto the surface of the negative type photocurable coating film for exposing to light so that the black coating film may remain in the shape of a grate and an area free of the transparent electrode between stripe-shaped transparent electrodes may be covered with the black coating film, followed by dipping into the alkali developing solution (a) at 25° C.; for 60 seconds to develop the photocurable coating film and black coating film simultaneously.

Next, the negative type photocurable resist film in the non-exposed area was removed by a 3% aqueous caustic soda solution to form a black matrix.

The black matrix was well patterned in the shape of a stripe of line/space=100/20 µm. On the other hand, in the case where the black coating film has a film thickness of 15 µm by three times, the black matrix was well patterned in the shape of a stripe of line/space=100/20 µm. The black coating film formed as above had a volume resistivity of $10^{10}$ Ω·cm or more to be good.

Example 10

A black coating film was formed on a transparent glass plate in the same manner as in Example 1.

Next, the negative type dry film 2 was laminated on the above black coating film so that a photocurable surface of the dry film may be folded thereon, followed by removing the polyethylene terephthalate release paper to form a negative type photocurable dry film on the black coating film.

Next, an argon laser (oscillating wave length 488 nm) of 5 mj/cm² was irradiated in the shape of a pattern directly onto the surface of the negative type photocurable coating film for exposing to light so that the black coating film may remain in the shape of a grate and an area free of the transparent electrode between stripe-shaped transparent electrodes may be covered with the black coating film, followed by dipping into the acid developing solution (b) at 25° C. for 60 seconds for developing.

Next, the exposed black coating film was developed by the alkali developing solution at 25° C.

Next, the negative type photocurable resist film in the non-exposed area was removed by a 3% aqueous hydrochloric acid solution to form a black matrix.

The black matrix was well patterned in the shape of a stripe of line/space=100/20 µm. On the other hand, in the case where the black coating film has a film thickness of 15 µm by three times, the black matrix was well patterned in the shape of a stripe of line/space=100/20 µm. The black coating film formed as above had a volume resistivity of $10^{10}$ Ω·cm or more to be good.

Example 11

A black coating film was formed on a transparent glass plate in the same manner as in Example 1.

Next, the positive type dry film 3 was laminated on the above black coating film so that a photocurable surface of the dry film may be folded thereon, followed by removing the polyethylene terephthalate release paper to form a positive type photocurable dry film on the black coating film.

Next, an argon laser (oscillating wave length 488 nm) of 5 mj/cm² was irradiated in the shape of a pattern directly onto the surface of the positive type photocurable coating film for exposing to light so that the black coating film may remain in the shape of a grate, and an area free of the transparent electrode between stripe-shaped transparent electrodes may be covered with the black coating film, followed by dipping into the alkali developing solution (a) at 25° C. for 60 seconds to develop the photocurable coating film and black coating film simultaneously.

Next, the positive type photocurable resist film in the non-exposed area was removed by a 3% aqueous caustic soda solution to form a black matrix.

The black matrix was well patterned in the shape of a stripe of line/space=100/20 µm. On the other hand, in the case where the black coating film has a film thickness of 15 µm by three times, the black matrix was well patterned in the shape of a stripe of line/space=100/20 µm. The black coating film formed as above had a volume resistivity of $10^{10}$ Ω·cm or more to be good.

Example 12

A black coating film was formed on a transparent glass plate in the same manner as in Example 1.

Next, the positive type dry film 4 was laminated on the above black coating film so that a photocurable surface of the dry film may be folded thereon, followed by removing the polyethylene terephthalate release paper to form a positive type photocurable dry film on the black coating film.

Next, an argon laser (oscillating wave length 488 nm) of 5 mj/cm$^2$ was irradiated in the shape of a pattern directly onto the surface of the positive type photocurable coating film for exposing to light so that the black coating film may remain in the shape of a grate and an area free of the transparent electrode between stripe-shaped transparent electrodes may be covered with the black coating film, followed by dipping into the acid developing solution (b) at 25° C. for 60 seconds for developing.

Next, the exposed black coating film was developed by the alkali developing solution (a) at 25° C.

Next, the positive type photocurable resist film in the non-exposed area was removed by a 3% aqueous hydrochloric acid solution to form a black matrix.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 13

Example 1 was duplicated except that the black coating composition B was used in place of the black coating composition A in Example 1, and the temperature of the developing solution was 20° C. to obtain a black matrix.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 14

Example 3 was duplicated except that the black coating composition B was used in place of the black coating composition A in Example 3, and the temperature of the developing solution was 20° C. to obtain a black matrix.

The black matrix was well patterned in the shape of a stripe of line/space=100/20 m. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 15

Example 12 was duplicated except that the black coating composition B was used in place of the black coating composition A in Example 12, and the temperature of the developing solution was 20° C. to obtain a black matrix.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μm. The black coating film formed as above had a volume resistivity of $10^{10}$ Ω·cm or more to be good.

Example 16

Example 1 was duplicated except that the black coating composition C was used in place of the black coating composition A, and the acid developing solution (b) was used as the developing solution of the black coating composition to obtain a black matrix.

The black matrix was well patterned in the shape of a stripe of line (pattern width)/space=100/20 μm. On the other hand, in the case where the black coating film has a film thickness of 15 μm by three times, the black matrix was well patterned in the shape of a stripe of line (pattern width)/space=100/20 μm. The black coating film formed as above had a volume resistivity of $10^{10}$ Ω·cm or more to be good.

Example 17

Example 1 was duplicated except that the organic solvent based heat-curable composition 1 was used in place of the water based negative type photocurable anionic composition 1, the YAG laser was used in place of the argon laser, and that a toluene organic solvent was used as the developing solution of the heat-curable coating film.

The black matrix was well patterned in the shape of a stripe of line/space=100/20 μm. On the other hand, in the case where the black coating film has a film thickness of 15 μm by three times, the black matrix was well patterned in the shape of a stripe of line/space=100/20 μ. The black coating film formed as above had a volume resistivity of $10^{10}$ Ω·cm or more to be good.

Comparative Examples 1–12

Examples 1–12 were duplicated except that the black coating composition E was used in place of the black coating composition A as in Examples 1–12 to form coating films of Comparative Examples 1–12 respectively. Tests were carried out in the same manners as in Examples. As the result, respective black matrixes were unsatisfactorily patterned in the shape of a stripe of line/space=95/30 μm. On the other hand, in the case where the black coating film has a film thickness of 15 μm by three times, the black matrixes were unsatisfactorily patterned in the shape of a stripe of 90/40 μm respectively. Corners of patterned coating films were round without forming a sharp and fine pattern respectively.

Example 18

A 0.6 mm thick glass·epoxy base board having a 18 μm thick copper circuit pattern on both sides was degreased, followed by soft etching, coating a resin composition of 100 parts (as solid content) of a heat-curable insulating liquid resin [polyimide resin (acid value 11 KOH mg/g, amine value 0, glass transition temperature 30° C.) prepared by reacting 932 parts of N-methyl-2-pyrrolidone, 284 parts of 4,4-diamino-3,3'-diethyl-5,5'-dimethyldiphenylmethane, 338 parts of benzophenone tetracarboxylic acid bianhydride and 120 parts of toluene at 180° C. for 4 hours], 12 parts of Epikote 1004(trade name, marketed by Oil Shell Co., Ltd., epoxy resin, glass transition temperature about 100° C.) and one part of CIIZ (trade name, marketed by Shikoku Chemicals Corporation, imidazole catalyst)] by roll coating or the like, optionally predrying and volatilizing the solvent to form an insulative film having a film thickness of about 60 μm.

Next, the water based negative type photocurable anionic composition 1 was coated onto the above insulating film so as to be a dry film thickness of 6 μm by roller coating, followed by drying at 80° C. for 10 minutes to form a negative type photocurable anionic coating film on the insulating film, irradiating an argon laser (oscillating wave length 488 nm) of 5 mj/cm$^2$ directly onto the surface of the negative type photocurable anionic coating film for exposing to light so that an interlayer-connecting via part may be formed in the insulative layer, dipping into the alkali developing solution (a) consisting of 0.25 wt % aqueous sodium carbonate solution at 25° C. for 60 seconds for developing to remove a photocurable coating film forming the via part, removing an insulating coating film forming the interlayer-connecting via part by the acid developing solution at 25° C., heat curing the insulative film at 200° C. for 20 minutes, removing the photocurable coating film by a 3% aqueous caustic soda solution to form an insulative layer having the interlayer-connecting via part having a copper layer at the bottom, forming a copper layer such as a copper plated layer on the surface thereof, removing the copper layer so that a necessary circuit pattern may be obtained, and repeating three times respective steps of the heat-curable insulating liquid resin coating, water based negative type photocurable anionic composition 1 coating, laser irradiation, photocurable coating film developing treatment, insulating film developing treatment, heat curing and copper layer formation to prepare a build up printed circuit board [line (pattern width)/space=100 μm/100 μm, via diameter 100 μm].

The printed circuit board showed nothing abnormal in the copper circuit pattern and no breaking in the circuit. The black coating film formed as above had a volume resistivity of 10$^{10}$ Ω·cm or more to be good.

Example 19

Example 18 was duplicated except that the water based positive type photocurable anionic composition 3 was used in place of the water based negative type photocurable anionic composition 1 in Example 18 to prepare a build up printed circuit board.

The printed circuit board obtained as above showed nothing abnormal in the copper circuit pattern and no breaking in the circuit. The black coating film obtained as above had a volume resistivity of 10$^{10}$ Ω·cm or more to be good.

Example 20

Example 18 was duplicated except that the negative type dry film 1 was used in place of the water based negative type photocurable anionic composition 1 in Example 18 to prepare a build up printed circuit board.

The printed circuit board obtained as above showed nothing abnormal in the copper circuit pattern and no breaking in the circuit. The black coating film obtained as above had a volume resistivity of 10$^{10}$ Ω·cm or more to be good.

Example 21

Example 18 was duplicated except that the positive type dry film 3 was used in place of the water based negative type photocurable anionic composition 1 in Example 18 to prepare a build up printed circuit board.

The printed circuit board obtained as above showed nothing abnormal in the copper circuit pattern and no breaking in the circuit. The black coating film obtained as above had a volume resistivity of 10$^{10}$ Ω·cm or more to be good.

Comparative Example 13

Example 18 was duplicated except that the developing temperature in the alkali developing and acid developing in Example 18 was 40° C. to prepare a build up printed circuit board. The resulting circuit board showed an abnormal copper circuit pattern and poor electrical conductivity of the circuit.

Example 22

A toluene organic solvent solution (solid content 60% by weight) of 100 parts of acrylic copolymer (methyl methacrylate 120 parts, isobornyl methacrylate 233 parts, 2-hydroxyethyl methacrylate 103 parts, methacrylic acid 47 parts, glass transition temperature 100° C., weight average molecular weight 14000), 3 parts of hexamethoxymelamine and 16 parts of phenol novolac resin was used as the heat-curable insulating liquid solder resist resin solution.

The above solder resist was coated onto a substrate having a 50 μm copper layer and a copper pattern interval of 180 μm so as to be a dry film thickness of 50 μm, followed by drying, coating the water based negative type photocurable anionic composition 1 so as to be a dry film thickness of 6 μm by roller coating, irradiating an argon laser (oscillating wave length 488 nm) of 5 mj/cm$^2$ so that 10 μm line width may be differently formed in the range of 50 μm to 130 μm between copper patterns, developing the photocurable coating film and solder resist film simultaneously by the alkali developing solution (a) at 25° C. for 30 seconds (developing properties), heat curing at 80° C. for 10 minutes, removing the photocurable coating film by a 3% aqueous caustic soda solution at 25° C. to read a line width of the remaining image (resolving properties). As the result, the developing properties was good without a developing residue, and the resolving properties was good and 50 μm. The insulating layer had a volume resistivity of 10$^{13}$ Ω·cm or more to be practically usable as a solder resist film.

Example 23

Example 22 was duplicated except that the water based negative type photocurable anionic composition 2 was used in place of the water based negative type photocurable anionic composition 1, and the acid developing solution (b) was used as the photocurable developing solution to form a solder resist film. As the result, the developing properties was good without a developing residue, and the resolving properties was good and 50 μm. The insulating layer had a volume resistivity of 10$^{13}$ Ω·cm or more to be practically usable as a solder resist film.

Example 24

Example 22 was duplicated except that the water based positive type photocurable anionic composition 3 was used in place of the water based negative type photocurable anionic composition 1. As the result, the developing properties was good without a developing residue, and the resolving properties was good and 50 μm. The insulating layer had a volume resistivity of 10$^{13}$ Ω·cm or more to be practically usable as a solder resist film.

Example 25

Example 22 was duplicated except that the negative type dry film 1 was used in place of the negative type photocurable anionic composition 1 to form a solder resist film. As the result, the developing properties was good without a developing residue, and the resolving properties was good and 50 μm. The insulating layer had a volume resistivity of $10^{13}$ Ω·cm or more to be practically usable as a solder resist film.

Example 26

Example 22 was duplicated except that the positive type dry film 3 was used in place of the negative type photocurable anionic composition 1 to form a solder resist film. As the result, the developing properties was good without a developing residue, and the resolving properties was good and 50 μm. The insulating layer had a volume resistivity of $10^{13}$ Ω·cm or more to be practically usable as a solder resist film.

Example 27

A black glass paste (a solution prepared by dissolving 50 g of an acrylic resin having an acid value of 30 KOH mg/g, a glass transition temperature of 50° C., 10 g of carbon black, 50 g of lead oxide-boron oxide-silicon dioxide based glass powder) was coated onto the surface of a glass base plate, followed by drying at 150° C. for 10 minutes, and coating the negative type photocurable anionic composition 1 to form a photocurable coating film.

Next, an argon laser (oscillating wave length 488 nm) of 5 mj/cm² was irradiated directly onto the surface of the negative type photocurable anionic coating film so as to obtain a predetermined pattern for exposing to light, dipping into the alkali developing solution (a) consisting of 0.25 wt % aqueous sodium carbonate solution at 25° C. for one second to develop the photocurable coating film and the glass paste coating film simultaneously, and heat curing at 600° C. for 30 minutes to obtain a black belt layer having a sharp width of 300 μm and a thickness of 5 μm. The black coating film formed as above was good and had a volume resistivity of $10^{10}$ Ω·cm or more.

Example 28

Example 27 was duplicated except that the water based positive type photocurable anionic composition 3 was used in place of the water based negative type photocurable anionic composition 1 to form a black bell layer. The black belt was good and had a sharp width of 300 μm and a thickness of 5 μm.

Example 29

Example 27 was duplicated except that the negative type dry film 1 was used in place of the water based negative type photocurable anionic composition to form a black belt layer. The black belt was good and had a sharp width of 300 μm and a thickness of 5 μm. The black coating film formed as above was good and had a volume resistivity of $10^{10}$ Ω·cm or more.

Example 30

Example 1 was duplicated except that the black coating composition D was used to form a black coating film D on a glass plate in the same manner as in Example 1.

The positive type dry film 3 was laminated onto the surface of the black coating film D so that the photocurable surface of the dry film 3 maybe folded on the surface of the black coating film, followed by removing the polyethylene terephthalate release paper to form the positive type dry film 3 on the black coating film, irradiating an argon layer (oscillating wave length 488 nm) of 5 mj/cm² directly onto the surface of the positive type dry film 3 so that the black coating film may form a predetermined pattern after developing for exposing to light, dipping into the alkali developing solution (a) at 25° C. for 60 seconds to simultaneously develop the exposed positive type dry film and black coating film D, heat curing the black coating film at 160° C. for 30 minutes, to form a black matrix.

The black matrix was well patterned in the shape of a stripe of line (pattern width)/space=100/20 μm. On the other hand, in the case where the black coating film has a film thickness of 15 μm by the times, the black matrix was well patterned in the shape of a stripe of line (pattern width)/space=100/20 μm. The black coating film formed as above had a volume resistivity of $10^{10}$ Ω·cm or more to be good.

Example 31

The positive type dry film 3 was formed on the black coating film in the same manner as in Example 30, followed by irradiating an argon layer (oscillating wave length 488 nm) of 5 mj/cm² directly onto the surface of the positive type dry film so as to be a line/space=50/100 μm and so that the black coating film D may form a predetermined pattern after developing for exposing to light, dipping into the alkali developing solution (a) at 25° C. for 60 seconds to simultaneously develop the exposed positive type dry film 3 and black coating film, heat curing the black coating film D at 160° C. for 30 minutes, irradiating the argon laser (oscillating wave length 488 nm) of 5 mj/cm² onto the surface of the positive type dry film for exposing to light, dipping into the alkali developing solution (a) at 25° C. for 60 seconds, and removing the positive type dry film 3 only to form a black matrix.

The black matrix was well patterned in the shape of a stripe of line (pattern width)/space=100/20 μm. On the other hand, in the case where the black coating film has a film thickness of 15 μm by three times, the black matrix was well patterned in the shape of a stripe of line (pattern width)/space=100/20 μm. The black coating film formed as above had a volume resistivity of $10^{10}$ Ω·cm or more to be good.

Example 32

The black coating composition A was coated onto the surface of the positive type dry film 3 by a spin coater, followed by drying at 80° C. for 10 minutes to form a black coating film having a thickness of 5 μm, laminating the surface of the black coating film A of the resulting dry film onto all over the surface of a base plate having on its surface a transparent electrode patterned in the shape of a stripe of line (pattern width)/space=100/20 μm on a transparent glass plate (200×200×1.1 mm), removing a polyethylene terephthalate release paper, irradiating the argon laser (oscillating wave length 488 nm) of 5 mj/cm² directly onto the surface of the positive type dry film 3 so that the black coating film may form a predetermined pattern after developing for exposing to light, dipping into the alkali developing solution (a) at 25° C. for 60 seconds to simultaneously develop the exposed positive try film and black coating film, heat curing the black coating film at 160° C. for 30 minutes to form a black matrix.

The black matrix was well patterned in the shape of a stripe of line (pattern width)/space=100/20 μm. On the other hand, in the case where the black coating film has a film thickness of 15 μm by three times, the black matrix was well patterned in the shape of a stripe of line (pattern width)/space=100/20 μm. The black coating film formed as above had a volume resistivity of $10^{11}$ Ω·cm or more to be good.

Effect of the Invention

As evident from the above descriptions of the constitution of the present invention, differently from the use of the photocurable resin composition as one layer of the insulating layer in the prior art, the use of the laminate consisting of two layers, i.e. the actinic ray-curable coating film layer and the insulating film layer makes it possible to independently design respective functions of the two layers, resulting in making wide uses possible.

What is claimed is:

1. A pattern-forming method which comprises the following steps:

(1) laminating an actinic ray-sensitive coating film layer onto the surface of an insulating film-forming resin layer applied onto a substrate;

(2) irradiating directly or through a photomask an actinic ray or heat wave thereonto so as to obtain a predetermined pattern;

(3) subjecting the actinic ray-sensitive coating film layer to a developing treatment to form a predetermined resist pattern coating film consisting of the actinic ray-sensitive coating film layer with an exposed area of the insulating film forming resin layer;

(4) and subjecting the exposed area of the insulating film-forming resin layer to a liquid developing treatment, thereby removing the exposed area of the insulating film-forming resin layer; and (5) removing the predetermined resist pattern coating film consisting of the actinic ray-sensitive coating film layer to form a predetermined insulating film pattern on the substrate, the insulating film-forming resin layer containing a resin having a glass transition temperature in the range of 15 to 250° C., provided that the glass transition temperature of the resin is higher than a developing temperature in the range of 10 to 80° C.

2. A pattern-forming method which comprises the following steps:

(1) laminating an actinic ray-sensitive coating film layer onto the surface of an insulating film-forming resin layer applied onto a substrate;

(2) irradiating directly or through a photomask an actinic ray or heat wave thereonto so as to obtain a predetermined pattern;

(3') simultaneously subjecting the actinic ray-sensitive coating film layer and the insulating film-forming resin layer to a liquid developing treatment so as to obtain a predetermined pattern; and (4') removing the actinic ray-sensitive coating film layer of the predetermined pattern to form a predetermined insulating film pattern on the substrate, the insulating film-forming resin layer containing a resin having a glass transition temperature in the range of 15 to 250° C., provided that the glass transition temperature of the resin is higher than a developing temperature in the range of 10 to 80° C.

3. A pattern-forming method as claimed in claim 1, wherein the insulating film-forming resin layer is a thermoplastic resin layer.

4. A pattern-forming method as claimed in claim 1, wherein the insulating film-forming resin layer is a curable resin layer, and the curable resin layer is not cured during the step (2), but the insulating film-forming resin layer is cured after being subjected to a developing treatment.

5. A pattern-forming method as claimed in claim 1, wherein the insulating film-forming resin layer is a curable resin layer capable of being postcured by light or heat after the step (4).

6. A pattern-forming method as claimed in claim 1, wherein the insulating film-forming resin layer contains a glass powder and an insulating resin or a conductive resin so that sintering of the insulating film-forming resin layer after the developing treatment of the actinic ray-sensitive coating film layer and insulating film-forming resin layer may form an insulating film layer free of a conductive resin layer and optionally an insulating resin.

7. A pattern-forming method as claimed in claim 1, wherein the actinic ray-sensitive coating film layer is a photosensitive coating film layer formed from a negative type photosensitive or positive type photosensitive resin composition.

8. A pattern-forming method as claimed in claim 1, wherein the actinic ray-sensitive coating film layer is a heat-sensitive coating film layer formed from a negative type heat-sensitive or positive type heat-sensitive resin composition.

9. A pattern-forming method as claimed in claim 1, wherein the actinic ray-sensitive coating film layer is formed from a liquid resist or dry resist film.

10. A pattern-forming method as claimed in claim 1, wherein the actinic ray-sensitive coating film layer is formed from a dry resist film by a method which comprises applying a dry resist film formed by laminating a supporting film layer and the actinic ray-sensitive coating film layer to the insulating film-forming resin layer so that another surface of the actinic ray-sensitive coating film layer in the dry resist film: may contact with the surface of the insulating film-forming resin layer, followed by removing the supporting film layer from the actinic ray-sensitive coating film layer, and performing the steps (2), (3), (4) and (5) as claimed in claim 1.

11. A pattern-forming method as claimed in claim 1, wherein the actinic ray-sensitive coating film layer is formed from a dry resist film by a method which comprises applying a dry resist film formed by laminating a supporting film layer and the actinic ray-sensitive coating film layer to the insulating film-forming resin layer so that another surface of the actinic ray-sensitive coating film layer in the dry resin film may contact with the surface of the insulating film-forming resin layer, followed by removing the supporting film layer from the actinic ray-sensitive coating film layer and performing the steps (2), (3), (4) and (5), or followed by performing the step (2), removing the supporting film layer from the actinic ray-sensitive coating film layer, and performing the steps (3), (4) and (5).

12. A pattern-forming method as claimed in claim 1, wherein the insulating film-forming resin layer, the actinic ray-sensitive coating film layer and the supporting film layer are laminated to form a dry resist film, and the dry resist film is applied to a substrate so that another surface of the insulating film-forming resin layer in the dry resist film may contact with the surface of the substrate, followed by removing the supporting film layer from the actinic ray-sensitive coating film layer and performing the steps (2), (3), (4) and (5), as claimed in claim 1, or followed by performing the step (2), removing the supporting film layer from the actinic ray-sensitive coating film layer and performing the steps (3), (4) and (5).

13. A pattern-forming method as claimed in claim 2, wherein the actinic ray-sensitive coating film layer is formed by a method which comprises applying a dry resist film formed by laminating a supporting film layer and the actinic ray-sensitive coating film layer to the insulating film-forming resin layer so that another surface of the actinic ray-sensitive coating film layer in the dry resist film may contact with the surface of the insulating film-forming resin layer, followed by removing the supporting film layer from the actinic ray-sensitive coating film layer, and performing the steps (2), (3') and (4') as claimed in claim 2.

14. A pattern-forming method as claimed in claim 2, wherein the actinic ray-sensitive coating film layer is formed from a dry resist film by a method which comprises applying a dry resist film formed by laminating a supporting film layer and the actinic ray-sensitive coating film layer to the insulating film-forming resin layer so that another surface of the actinic ray-sensitive coating film layer in the dry resist film may contact with the surface of the insulating film-forming resin layer, followed by removing the supporting film layer from the actinic ray-sensitive coating film layer, and performing the steps (2), (3') and (4'), or followed by performing the step (2), removing the supporting film layer from the actinic ray-sensitive coating film layer, and performing the steps (3') and (4').

15. A pattern-forming method as claimed in claim 2, wherein the insulating film-forming resin layer, the actinic ray-sensitive coating film layer and the supporting film layer are laminated to form a dry resist film, and the dry resist film is applied to a substrate so that another surface of the insulating film-forming resin layer may contact with the surface of the substrate, followed by removing the supporting film layer from the actinic ray-sensitive coating film layer and performing the steps (2), (3') and (4') as claimed in claim 2, or followed by performing the step (2) of the present invention, removing the supporting film layer from the actinic ray-sensitive coating film layer and performing the steps (3') and (4').

16. A pattern-forming method as claimed in claim 2, wherein the insulating film-forming resin layer is a thermoplastic resin layer.

17. A pattern-forming method as claimed in claim 2, wherein the insulating film-forming resin layer is a curable resin layer, and the curable resin layer is not cured during the step (2), but the insulating film-forming resin layer is cured after being subjected to a developing treatment.

18. A pattern-forming method as claimed in claim 2, wherein the insulating film-forming resin layer is a curable resin layer capable of being postcured by light or heat after the step (3').

19. A pattern-forming method as claimed in claim 2, wherein the insulating film-forming resin layer contains a glass powder and an insulating resin or a conductive resin so that sintering of the insulating film-forming resin layer after the developing treatment of the actinic ray-sensitive coating film layer and insulating film-forming resin layer may form an insulating film layer free of a conductive resin layer and optionally an insulating resin.

20. A pattern-forming method as claimed in claim 2, wherein the actinic ray-sensitive coating film layer is a photosensitive coating film layer formed from a negative type photosensitive or positive type photosensitive resin composition.

21. A pattern-forming method as claimed in claim 2, wherein the actinic ray-sensitive coating film layer is a heat-sensitive coating film layer formed from a negative type heat-sensitive or positive type heat-sensitive resin composition.

22. A pattern-forming method as claimed in claim 2, wherein the actinic ray-sensitive coating film layer is formed from a liquid resist or dry resist film.

* * * * *